United States Patent
Kanoun

(10) Patent No.: US 12,007,358 B2
(45) Date of Patent: Jun. 11, 2024

(54) POTENTIOSTAT WITH OFFSET CALIBRATION

(71) Applicant: SEMICONDUCTOR COMPONENTS INDUSTRIES, LLC, Phoenix, AZ (US)

(72) Inventor: Moez Kanoun, Waterloo (CA)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 788 days.

(21) Appl. No.: 16/948,409

(22) Filed: Sep. 17, 2020

(65) Prior Publication Data

US 2021/0262977 A1 Aug. 26, 2021

Related U.S. Application Data

(60) Provisional application No. 62/979,692, filed on Feb. 21, 2020.

(51) Int. Cl.
| | |
|---|---|
| *G01N 27/49* | (2006.01) |
| *G01N 27/416* | (2006.01) |
| *G01N 27/417* | (2006.01) |
| *H03F 3/347* | (2006.01) |

(52) U.S. Cl.
CPC ..... *G01N 27/4175* (2013.01); *G01N 27/4163* (2013.01); *H03F 3/347* (2013.01); *H03F 2200/129* (2013.01); *H03F 2200/375* (2013.01)

(58) Field of Classification Search
CPC ............. G01N 27/4175; G01N 27/4163
See application file for complete search history.

(56) References Cited

U.S. PATENT DOCUMENTS

2008/0202944 A1* 8/2008 Santoli ............... G01N 27/4163
205/775

OTHER PUBLICATIONS

Hamed Mazhab Jafari et al., Chopper-Stabilized Bidirectional Current Acquisition Circuits for Electrochemical Amperometric Biosensors. IEEE Transactions on Circuits and Systems—I: Regular Papers, 2013.

(Continued)

*Primary Examiner* — Alesa Allgood
(74) *Attorney, Agent, or Firm* — Brake Hughes Bellermann LLP

(57) ABSTRACT

A rail-to-rail potentiostat may require an offset current in order to support a bidirectional work electrode current at a work electrode. This offset current may improve measurements of the work electrode current made a dual-slope analog-to-digital converter, especially when the work electrode current is small, but can also lead to inaccuracies (e.g., due to a temperature coefficient) if it is not properly calibrated. Accordingly, bidirectional potentiostat is disclosed that can be configured in a normal configuration for measurement of a work electrode current or a calibration configuration for measurement (i.e., calibration) of an offset current. The reconfigurability allows calibrations to be taken as needed, on a schedule, or as specified by a user. The reconfiguration can also allow for maintaining a work electrode voltage and a work electrode current during calibration so that an electrochemical experiment using a cell coupled to the bidirectional potentiostat is unaffected by the calibration.

23 Claims, 9 Drawing Sheets

(56) References Cited

OTHER PUBLICATIONS

Sean Fischer et al., Low-Noise Integrated Potentiostat for Affinity-Free Protein Detection With 12 nV/rt-Hz at 30 Hz and 1.8 pA rms Resolution. IEEE Solid-State Circuits Letters, 2019.
Haitao Li et al., Ultra-compact Microwatt CMOS Current Readout With Picoampere Noise and Kilohertz Bandwidth for Biosensor Arrays. IEEE Transactions on Biomedical Circuits and Systems, 2018.

* cited by examiner

POTENTIOSTAT WITH OFFSET CALIBRATION

CROSS-REFERENCE TO RELATED APPLICATION

This application claims the benefit of U.S. Provisional Application No. 62/979,692, filed on Feb. 21, 2020, which is hereby incorporated by reference in its entirety.

FIELD OF THE DISCLOSURE

The present disclosure relates to electronics for electrochemical instrumentation and more specifically to a bidirectional potentiostat having an offset calibration circuit.

BACKGROUND

Chemical experiments may use an electrochemical cell (i.e., cell) that is configured to generate an electrical signal (e.g., current) based on a chemical reaction. A work electrode of the cell can be coupled to a potentiostat circuit (i.e., potentiostat). The potentiostat is configured to (i) set/maintain a voltage on the work electrode and (ii) measure a work electrode current (iwe) flowing into or out of the cell at the work electrode. In some applications (e.g., glucose sensing), the work electrode current may be on the order of picoamperes (pA), which can be difficult to sense accurately. One reason for this difficulty, results from an offset current added to the work electrode current to improve a linearity of a sensor used to measure the work electrode current and to allow for bidirectional measurements of the work electrode current. Without calibration, variations in the offset current could correspond to errors in the sensing of the work electrode current.

SUMMARY

In at least one aspect, the present disclosure generally describes a method for measuring a work electrode current. The method including generating a first output current using a potentiostat coupled to a work electrode. The first output current includes a work electrode current component and an offset current component. The method further includes converting the first output current to a first digital word and modifying the first digital word using a calibration factor, stored in a memory, to obtain a measurement of the work electrode current. The method further includes detecting a calibration event. The method further includes performing a calibration. Performing the calibration includes reconfiguration the potentiostat for calibration. The calibration further includes generating, using the reconfigured potentiostat, a second output current. The second output current includes the offset current component and does not include the work electrode current. The calibration further includes converting the second output current to a second digital work and creating/updating the calibration factor stored in the memory according to the second digital word.

In another aspect, the present disclosure generally describes a bidirectional potentiostat configurable in a normal configuration or a calibration configuration. The bidirectional potentiostat includes a front-end portion that includes a first feedback amplifier coupled to a work electrode and a replica feedback amplifier not coupled to the work electrode. In the normal configuration, the first feedback amplifier is coupled to a sensing and digitizing portion (i.e., sensing/digitizing portion) and the replica feedback amplifier is decoupled from the sensing/digitizing portion. In the calibration configuration, the first feedback amplifier is decoupled from the sensing/digitizing portion and the replica feedback amplifier is coupled to the sending/digitizing portion.

In another aspect, the present disclosure generally describes a cell measurement system. The cell measurement includes an electrochemical cell having a work electrode and a bidirectional potentiostat. The bidirectional potentiostat is configured into a normal configuration or a calibration configuration. The bidirectional potentiostat includes a front-end portion that includes a first feedback amplifier coupled to the work electrode and a replica feedback amplifier not coupled to the work electrode. In the normal configuration, the first feedback amplifier of the front-end portion is coupled to a sensing/digitizing portion and the replica feedback amplifier of the front-end portion is decoupled from the sensing/digitizing portion. In the calibration configuration, the first feedback amplifier of the front-end portion is decoupled from the sensing/digitizing portion and the replica feedback amplifier of the front-end portion is coupled to the sensing/digitizing portion. The bidirectional potentiostat further includes an offset portion that includes an offset current source and a replica offset current source. In the normal configuration, the offset current source is coupled to the work electrode and the first feedback amplifier, and the replica offset current source is coupled to the replica feedback amplifier. In the calibration configuration, the offset current source is coupled to the replica feedback amplifier, and the replica offset current source is coupled to the work electrode and the first feedback amplifier. The bidirectional potentiostat further includes a current-conveyer portion that is coupled between the front-end portion and the sensing/digitizing portion. The current-conveyer portion includes a first current mirror and a second current mirror.

In a possible implementation of the cell measurement system, the sensing/digitizing portion of the bidirectional potentiostat includes a dual-slope analog-to-digital converter.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

The components in the drawings are not necessarily to scale relative to each other. Like reference numerals designate corresponding parts throughout the several views.

DETAILED DESCRIPTION

A potentiostat that accepts a wide range (i.e., rail-to-rail) of set voltages and provides measurements of a bidirectional work electrode current is disclosed. The potentiostat includes circuits and methods to provide a calibration and cancellation of an offset current to improve the accuracy of a measured work electrode current without requiring any changes to a cell measurement system in operation. The disclosed circuits and methods can advantageously reduce a temperature drift and a work electrode voltage dependency of measurement by the potentiostat. The calibration of the potentiostat according to the disclosed approach may not significantly affect or interrupt functions of the potentiostat. The disclosed circuits and methods may be cost and time efficient as they do not require precision circuits or lengthy calibration times.

Figure 1:
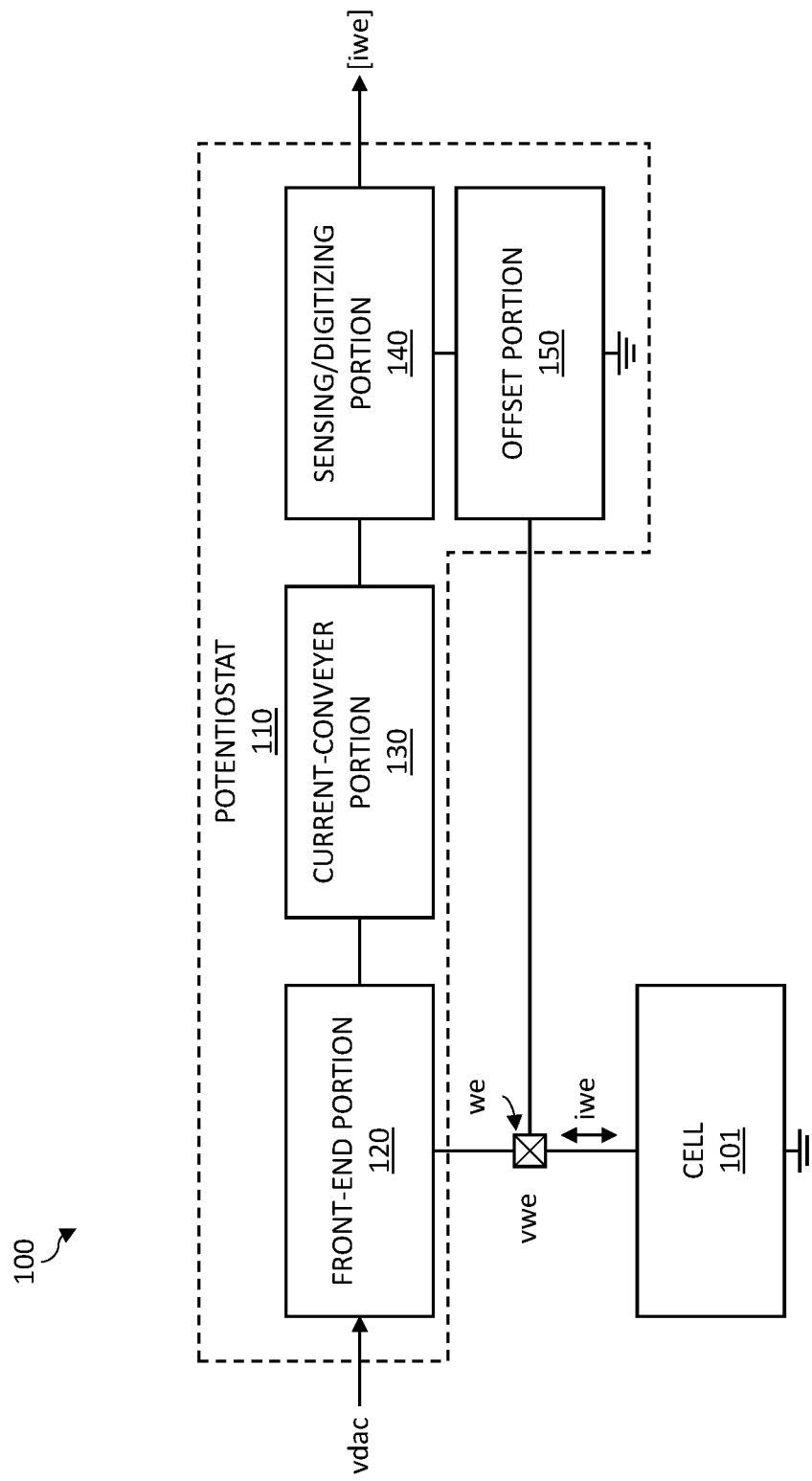
FIG. 1 is a block diagram of a cell measurement system according to an implementation of the present disclosure.

FIG. 1 is a block diagram of a cell measurement system according to an implementation of the present disclosure. The cell measurement system 100 includes a potentiostat 110 that is coupled to a work electrode (we) of a cell 101. The potentiostat 110 is configured to set a work electrode voltage according to a set voltage (vdac) received at an input to the potentiostat. Additionally, the potentiostat 110 is configured to provide a measurement of a work electrode current (iwe) at an output of the potentiostat. For example, the measurement may be a digital signal ([iwe]) corresponding to the work electrode current.

The potentiostat 110 may be implemented variously. One possible implementation of the potentiostat that has low power and small die area requirements, includes a current-conveyer portion 130. The current-conveyer portion 130 allows the cell 101 to be electrically decoupled from sensing and digitizing circuitry of a sensing and digitizing portion (i.e. sensing/digitizing portion 140) so that the work electrode current is not significantly affected by its measurement. The current-conveyer portion 130 may include one or more current mirrors. Each of the one or more current mirrors may be implemented variously to improve performance. For example, the one or more current mirrors may be implemented in a cascode topology to reduce a variation in transistors due to process from affecting an accuracy of a copied current. Additionally, the one or more current mirrors may include chopper circuits to reduce noise.

The potentiostat 110 can also include front-end circuitry (i.e., a front-end portion 120) that is coupled between the cell 101 and the current-conveyer portion 130. FIG. 2A is a schematic including a front-end portion of a potentiostat according to a possible implementation of the present disclosure. As shown, the front-end portion 220 is coupled to a work electrode (we) of the cell 201, having at least a work electrode (we) and a reference electrode (re). The front-end portion 220 can include an amplifier (A1) and a transistor (MPG) that are configured to set a work electrode voltage (vwe) equal to a set voltage (vdac) and to conduct the work electrode current (iwe).

The potentiostat 110 of FIG. 1 further includes circuitry configured to sense a current received from the current-conveyer portion 130 and to digitize the sensed current (i.e., a sensing/digitizing portion 140). The sensing/digitizing portion 140 can be coupled to the offset portion. The offset portion can help to improve a linearity of the sensing and to provide a bidirectional operation, as will be discussed. While allowing for bidirectional measurements, the offset current can affect the sensing/digitizing results and can degrade a temperature stability of the potentiostat.

The circuit configuration shown in FIG. 2A supports a work electrode current in a direction into the cell 201 (i.e., out of the potentiostat). In other words, the circuit configuration shown in FIG. 2A supports a work electrode current that is sunk by the cell (i.e., +iwe). The configuration shown in FIG. 2A does not support a work electrode current in a direction out of the cell (i.e., into the potentiostat). In other words, the circuit configuration shown in FIG. 2A supports a work electrode current that is sourced by the cell (i.e., −iwe).

Figure 2B:
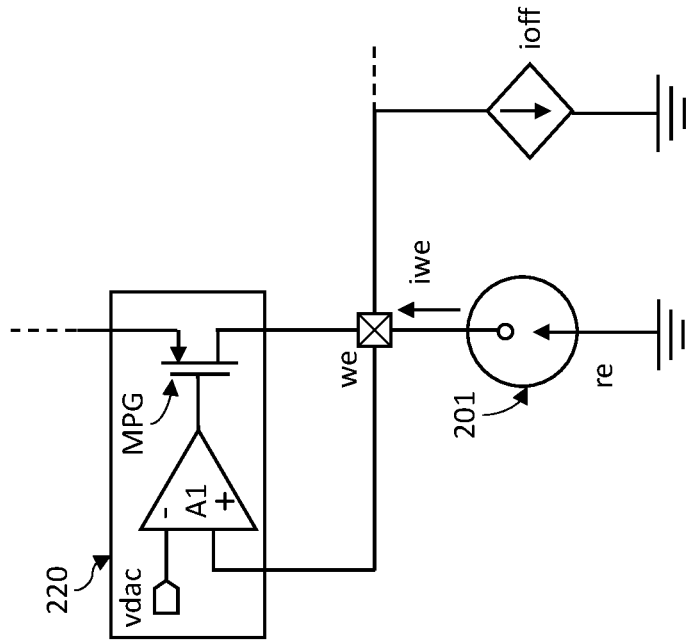
FIG. 2B is a schematic including the front-end portion of the potentiostat of FIG. 2A including an offset current source to facilitate measurement of a work electrode current sourced by the cell.
Figure 2A:
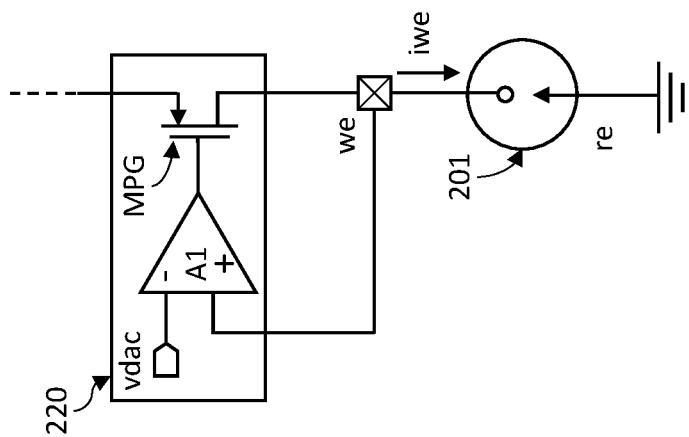
FIG. 2A is a schematic including a front-end portion of a potentiostat according to a possible implementation of the present disclosure and illustrating a work electrode current that is sunk by a cell.

FIG. 2B is a schematic including the front-end portion of the potentiostat of FIG. 2A including an offset current source (ioff) to facilitate measurement of a work electrode current sourced by the cell (i.e., −iwe). In other words, the offset current can provide a path for the sourced current to flow in the potentiostat. Accordingly, the potentiostat 110 of FIG. 1 can include an offset portion 150 to support a bidirectional work electrode current (i.e., ±iwe). In other words, the potentiostat 110 shown in FIG. 1 can be bidirectional.

Figure 3A:
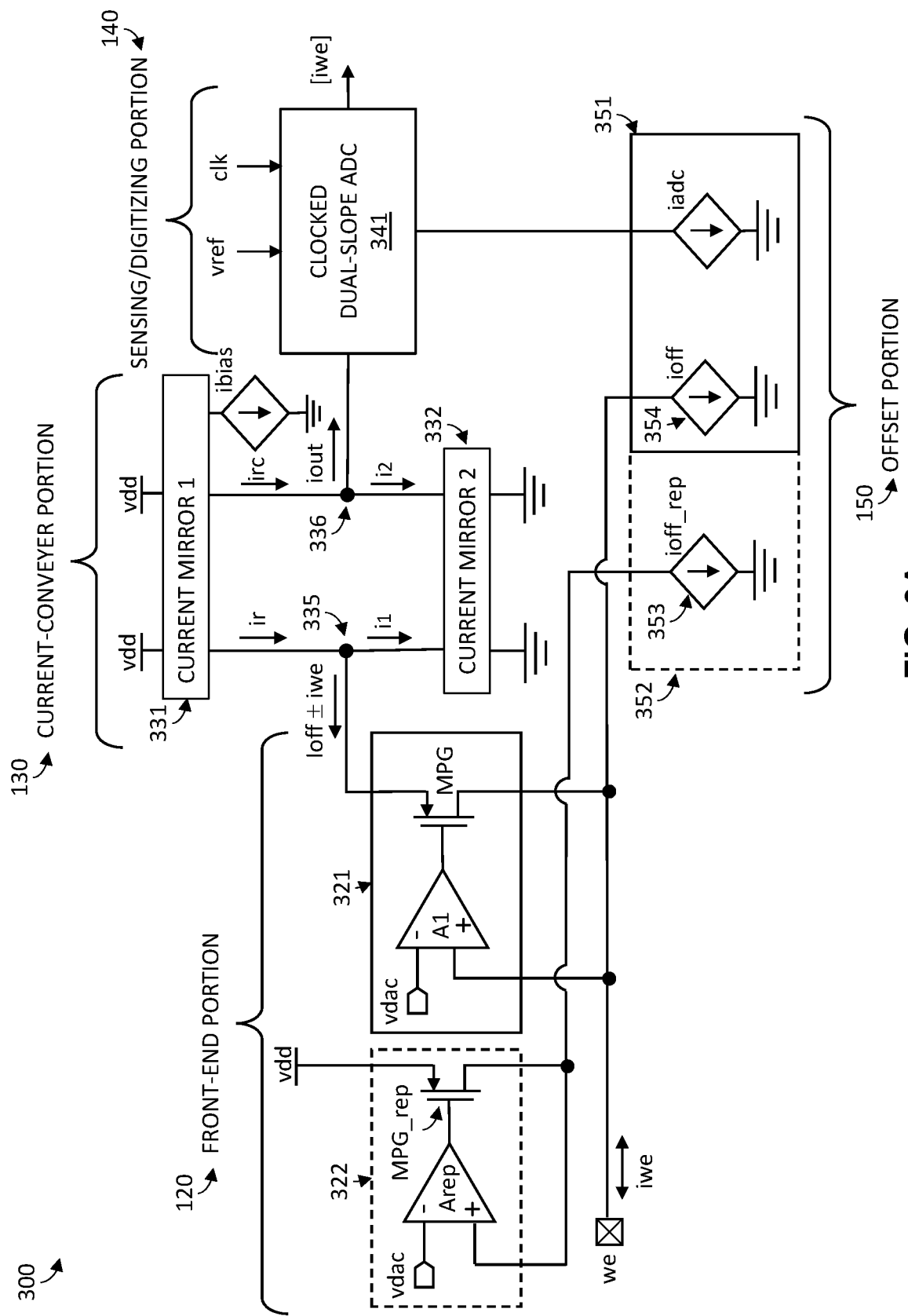
FIG. 3A is a schematic block diagram of a potentiostat in a configuration for normal operation according to an implementation of the present disclosure.

FIG. 3A is a schematic block diagram of a potentiostat according to an implementation of the present disclosure. The potentiostat 300 includes an offset portion 150 to provide a bidirectional measurement of the work electrode current (iwe). A front-end portion 120 is configured by a first feedback amplifier 321 to regulate a set voltage (vdac) at the work electrode (we). A first current mirror 331 of a current-conveyer portion 130 is configured to provide a reference current (ir) from a biasing current (ibias) without consuming (i.e., dropping) a significant portion of an upper rail voltage (vdd). Accordingly, an input node 335 coupled to a first front end transistor (MPG) can be at approximately the upper rail voltage (vdd). As a result, the set voltage (vdac) can be in a range that substantially spans a range of voltages from a lower rail of the potentiostat (e.g., a ground voltage) to an upper rail of the potentiostat (i.e., vdd). This aspect may be especially advantageous when the rail-to-rail voltage of the potentiostat is small, in which case a significant voltage drop by a device can limit a range of work electrode voltages that can be applied by the potentiostat. The potentiostat of FIG. 3A can avoid this limit in set voltage range and can therefore be referred to as a rail-to-rail potentiostat.

The first current mirror is further configured to generate a cancellation reference current (irc) as shown in the equation below.

$$irc = ir \qquad (1)$$

The current-conveyer portion 130 can include a second current mirror 332. The second current mirror 332 is configured to generate a second current (i2) that is a copy of a first current (i1), where the first current (i1) is given by the equation below.

$$i2 = i1 = ir - (ioff \pm iwe) \qquad (2)$$

Accordingly, at an output node 336, an output current (iout) can be given by the equation below.

$$\text{iout}=\text{irc}-i2=\text{ioff}\pm\text{iwe} \quad (3)$$

In other words, the output current (iout) is the work electrode current combined (i.e., sum, difference) with the offset current. The output current is received as an input to the sensing/digitizing portion 140. The sensing/digitizing portion 140 is configured to generate a digital signal ([iwe]) corresponding to the work electrode current.

In a possible implementation, the sensing/digitizing portion 140 is an analog-to-digital converter (i.e., ADC), such as a dual-slope ADC. In the disclosure, a clocked dual-slope ADC will be considered. The clocked dual-slope ADC 341 is configured to charge and discharge a capacitor. The capacitor can be charged with the output current (iout) and discharged with a current (e.g., iadc-iout) corresponding to an ADC current and the output current. The ADC current can be generated by a current copier (e.g., current mirror) 351 included in the offset portion 150. The current copier 351 can be configured to generate the ADC current (and the offset current, ioff) from an ADC-reference current (not shown). The generation of the currents can be configured so that the ADC current is a duplicate, or a scaled version, of the offset current (ioff).

The offset current may change or drift according to changes in environment (e.g., temperature) or circuit parameters (e.g., set voltage). Additionally, the ADC current generated by the current copier 351 may not change or drift in exactly the same way as the offset current. A low temperature dependency can require that the ADC current have a very low temperature coefficient. Any mismatch between iadc and ioff could lead to a high temperature coefficient associated with the measurement of the work electrode current.

Generating the digitized version of the work electrode current (i.e., [iwe]) can require the removal (e.g., subtraction) of the offset current (ioff). However, an accurate value of the offset current (ioff) may be required. For example, the offset current may be much larger than the work electrode current. Accordingly, small variations in the offset current can affect the accuracy of the work electrode current. Removal of the offset current from iout (i.e., prior to digitization) may not be desirable however because the offset may improve performance (e.g., linearity) of the clocked dual-slope ADC. For at least this reason it can be desirable to measure ioff as a calibration step in the determination of the work electrode current, and to remove the calibrated ioff after digitization. Accordingly, the potentiostat 300 includes offset calibration circuitry to measure the offset current.

The potentiostat 300 includes calibration circuitry. The calibration circuitry can be included in the front-end portion 120 and in the offset portion 150. For example, the front-end portion 120 can include a replica feedback amplifier 322 for calibration. The replica feedback amplifier 322 can include a replica amplifier (Arep) that is substantially identical to a first amplifier (A1) of the first feedback amplifier 321. The replica feedback amplifier 322 can further include a replica transistor (MPG_rep) that is substantially identical to a first transistor (MPG) of the first feedback amplifier 321. The offset portion 150 can include a portion of the current copier 351 for calibration. For example, the current copier 351 can include a portion 352 to generate a replica offset current (ioff_rep) that is substantially equal to the offset current.

The potentiostat of FIG. 3A is in a configuration for normal operation (i.e., iwe measurement). When configured for normal operation (i.e., normal configuration, normal mode), the calibration circuitry of the front-end portion 120 and the offset portion 150 does not affect the outputs (i.e., vwe, iwe) of the potentiostat. the replica transistor (MPG_rep) is tied to the upper rail (vdd) of the potentiostat and the replica offset current source 353. The calibration circuitry is not coupled to the current-conveyer portion 130 or the sensing/digitizing portion 140. In some implementations, the calibration circuitry can be disabled during the normal mode to reduce power consumption.

Figure 3B:
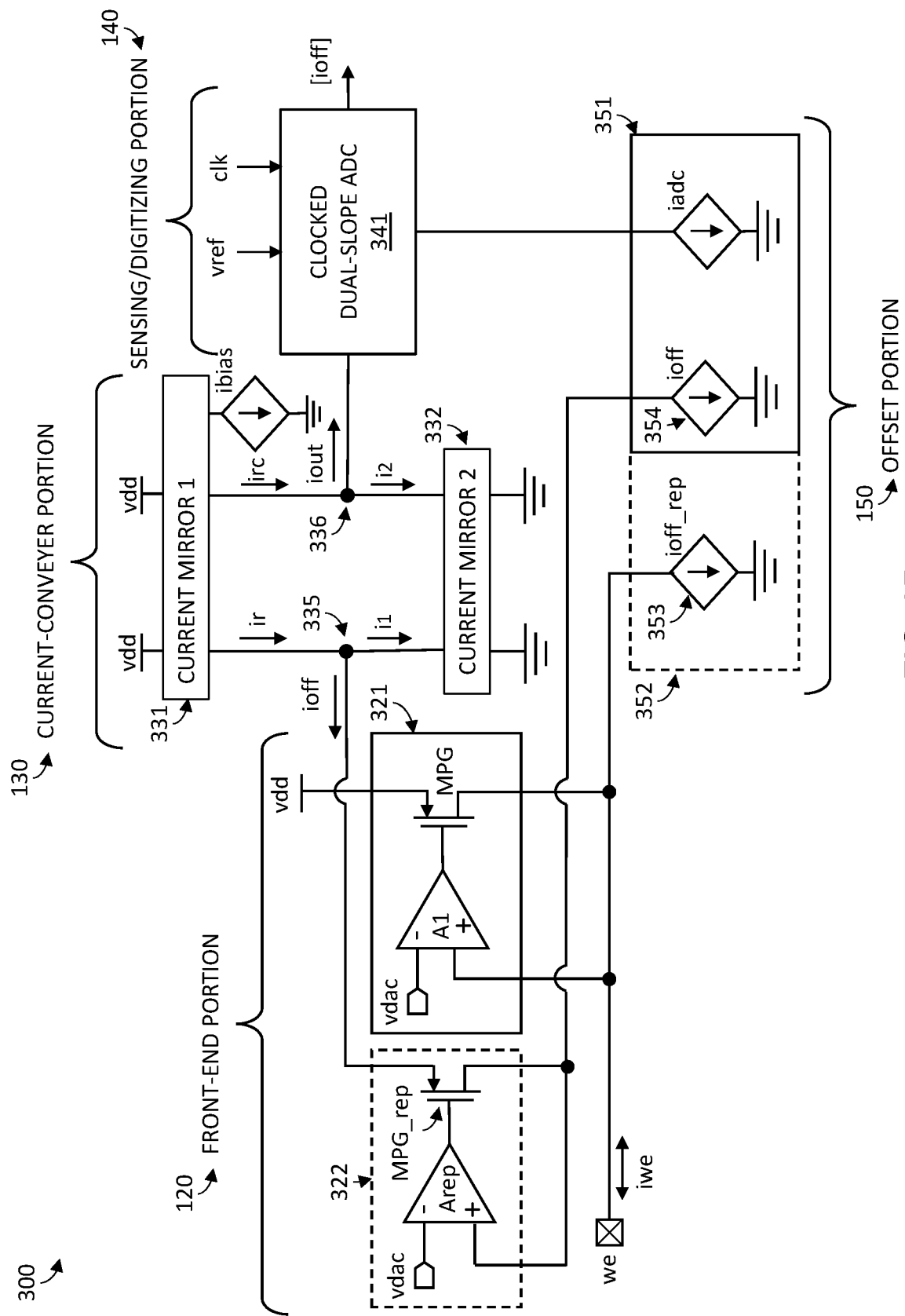
FIG. 3B is a schematic block diagram of the potentiostat of FIG. 3A in configuration for calibration according to an implementation of the present disclosure.

FIG. 3B is a schematic block diagram of the potentiostat 300 in configuration for calibration (i.e., calibration configuration, calibration mode) according to an implementation of the present disclosure. In the calibration configuration, the replica feedback amplifier 322 of the front-end portion 120 and is tied to the input (node) 335 and to the offset current source 354 of the current copier 351. As a result, the output current (iout) measured by the sensing/digitizing portion 140 only includes only the offset current (i.e., iout=ioff).

In the calibration configuration, the work electrode current (iwe) is maintained by the first feedback amplifier 321 which is tied to the upper rail voltage (vdd) and to the replica offset current source 353 of the current copier 351. As a result, a digital signal corresponding to ioff (i.e., [ioff]) can be generated by the clocked dual-slope ADC 341, while the work electrode voltage and work electrode current are not significantly changed from their values in the normal configuration immediately before moving to the calibration configuration. In other words, the work electrode current and voltage are not interrupted and are not altered (significantly) by calibration.

The calibration of the offset current can be performed periodically (e.g., on a schedule) or as needed (e.g., user selected, change in environment and/or signal). The change between the normal configuration and the calibration configuration (and vice versa) can be accomplished using switches and control signals. The control signals may be triggered by a user or by an event. For example, a change in a work electrode voltage above a threshold or a temperature variation can trigger switching signals to reconfigure the potentiostat from a normal configuration to a calibration configuration. A calibration may then be performed (e.g., to obtain/store a calibration factor corresponding to the measured offset). After the calibration is competed switching signals can trigger switches in the potentiostat to reconfigure the potentiostat back to the normal configuration (FIG. 3A) from the calibration configuration (FIG. 3B).

Figure 4:
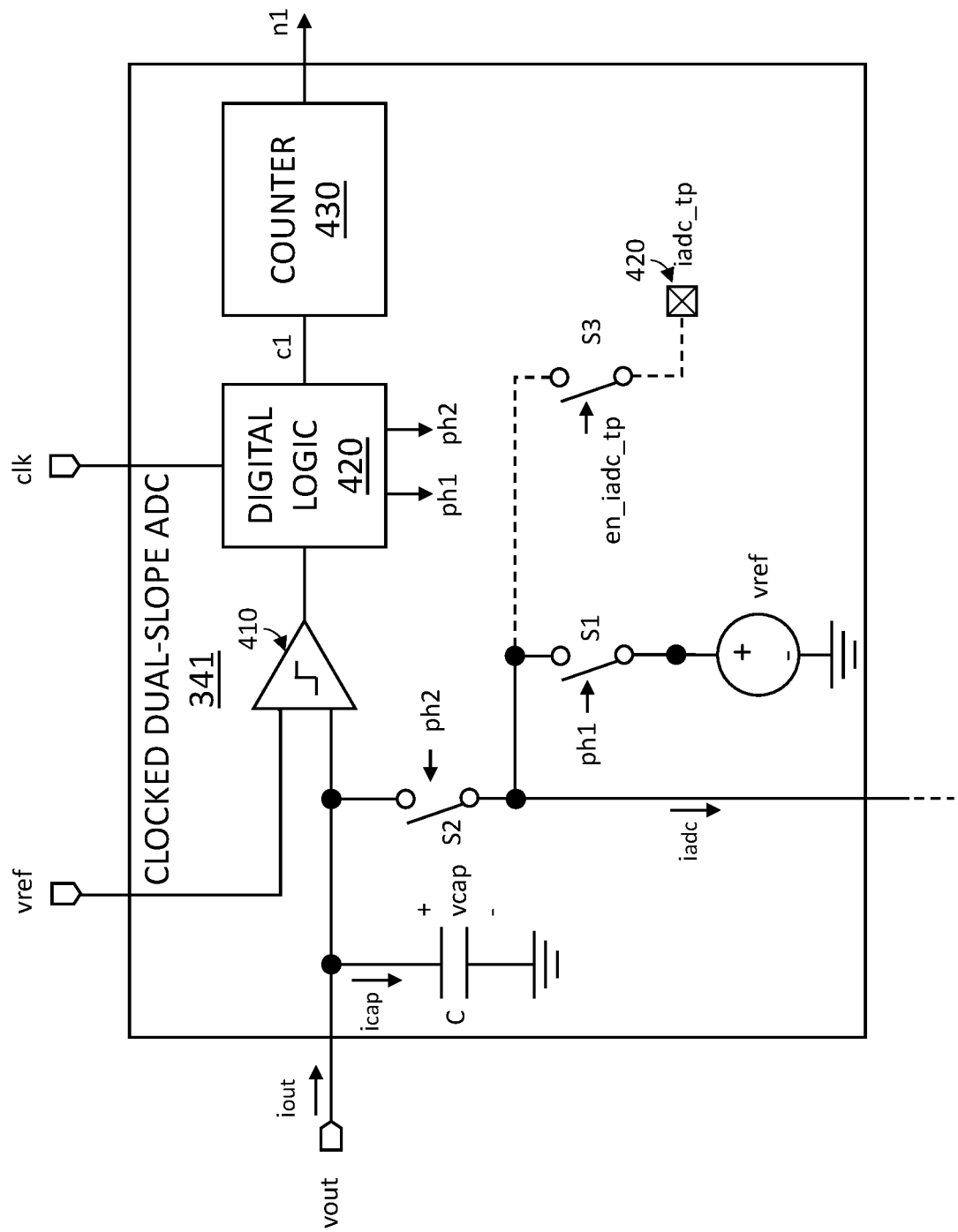
FIG. 4 is a schematic block diagram of a clocked dual-slope analog-to-digital converter (ADC) according to an implementation of the present disclosure.

FIG. 4 is a schematic block diagram of a clocked dual-slope ADC according to an implementation of the present disclosure. The clocked dual-slope ADC operates by charging and discharging synchronously (e.g., using a clock signal (clk)) a capacitor C. The capacitor is charged) with the current-conveyer output current, iout from an initial voltage until the voltage across the capacitor (vcap) crosses a known (e.g., input) reference voltage level (vref). At the next clock cycle, the capacitor is discharged using a known current (i.e., the adc current, iadc). The charge and discharging process is repeated for a given integration time (ntxtclk). Because the voltage on the capacitor is equal to its charging/discharging current integrated over time and because the voltage charged is equal to the voltage discharged, it can be shown that the current-conveyer output current (iout) is related to the known current (iadc), a measured charging time (Tchrg), and a known discharging time (Tdischrg), as shown in the equation below.

$$\text{1out}=(1\text{adc}-1\text{out})\cdot(T\text{dischrg})/(T\text{chrg}) \quad (4)$$

Accordingly, the clocked dual-slope ADC 341 includes a capacitor (C) and can include a plurality of switches (S1, S2) for configuring the capacitor to be charged or discharged. For example, when a second switch (S2) is OFF (i.e., open) a voltage (vcap) on the capacitor ramps up using the output current (iout). A first switch (S1) may be configured to be ON (i.e., closed) while the second switch is OFF (i.e., open) in order to keep the ADC-reference current (iadc) flowing to prevent delays or glitches during the transitions between charging and discharging events. When the second switch (S2) is ON (i.e., closed) and the first switch (S1) is OFF (i.e., open), the voltage (vcap) on the capacitor decreases linearly using the ADC (i.e., reference) current (iadc) (e.g., for a known duration). The process may then be repeated for a given integration time (nt×tclk).

The transition between charging and the discharging may be based on a caparison of the capacitor voltage vcap to a reference voltage vref. Accordingly, the clocked dual-slope ADC 341 can further include a comparator 410 configured to compare vcap to vref. and digital logic (e.g., latch, flip/flop, logic gate, etc.) to output switching signals (ph1, ph2) to respective switches to configure discharging after vcap reaches vref.

The clocked dual-slope ADC 341 can further include a counter 430 that can be configured to count clock (clk) cycles, while the capacitor (C) is charging in order to determine a digital value (n1) related to the measured charging time.

In some implementations, the clocked dual-slope ADC 341 can further include a third switch S3. To extract the gain of the potentiostat during calibration, the switch en_iadc_tp can be turned ON (e.g., by signal, en_iadc_tp) to route the ADC-reference current (iadc) to an output pad 420. The ADC-reference current (iadc) can then be trimmed to adjust (e.g., optimize) a temperature coefficient, at which point the ADC-reference current (iadc) can be measured and stored. The measured value of the ADC-reference current (iadc) represents the gain of the potentiostat.

Figure 5:
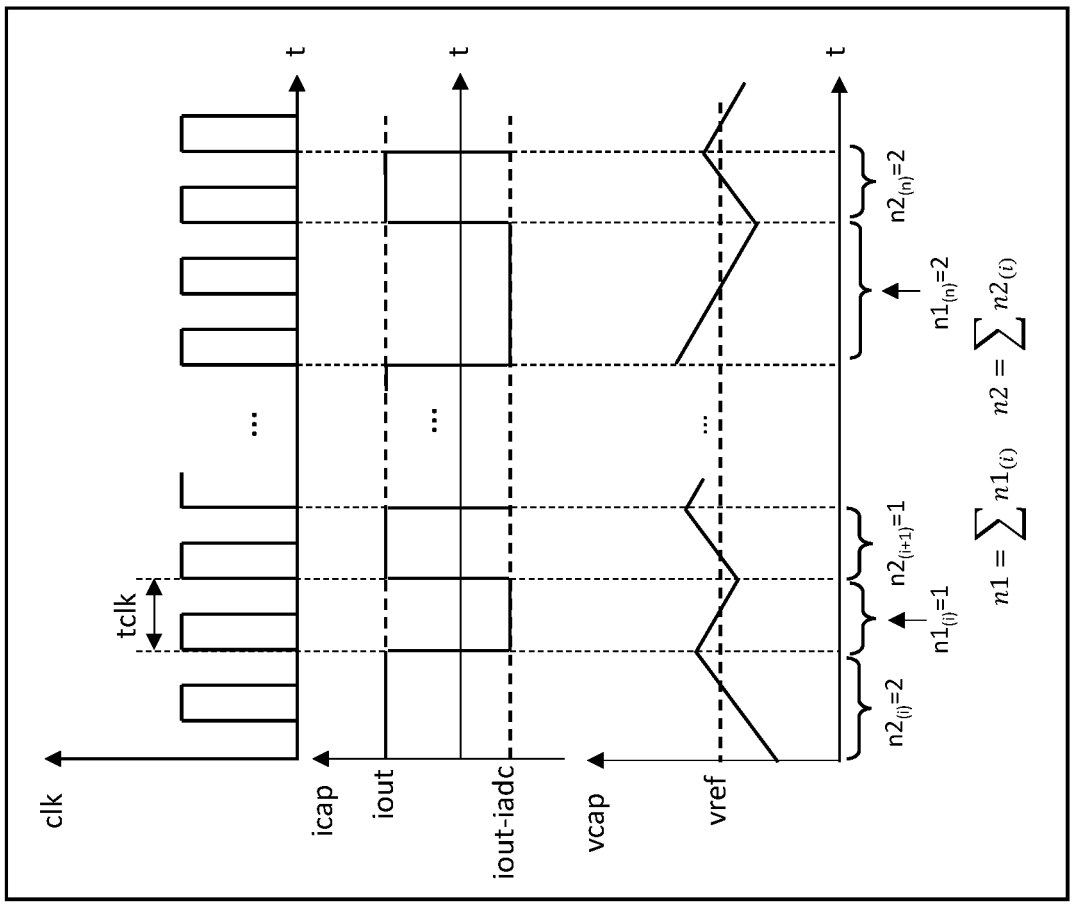
FIG. 5 illustrates a portion of a signal associated with a clocked dual-slope ADC.

FIG. 5 illustrates a portion of a first signal (vcap) associated with a clocked dual-slope ADC. As shown the voltage on the capacitor (vcap) increases linearly during the charging time. The number of clock cycles (i.e., $n2_{(i)}$) during a given charging period (i.e., i) are accumulated. Once the voltage on the capacitor (vcap) reaches the reference voltage (vref), the discharging process begins at the next clock edge (e.g., rising edge) following the crossing of vref. The number of clock cycles during a given discharging period (i.e., i) is denoted by $n1_{(i)}$. The total number of clock cycles during the acquisition time (nt) is the sum of $n1_{(i)}$ and $n2_{(i)}$ for all charging and discharging periods (i.e., nt=$\Sigma n1_{(i)}$+$\Sigma n2_{(i)}$=n1+n2). As shown in FIG. 4, during a charging period, the current charging the capacitor is iout, and during the discharging period, the current discharging the capacitor is the difference between the ADC-reference current (iadc) and the output current (iout) (i.e., iadc-iout).

The potentiostat can be configured in a normal configuration or a calibration configuration. In the normal configuration, iout can equal the sum of a work electrode current component (iwe) and an offset current component (ioff). In the calibration configuration, iout can equal just the offset current component (ioff).

The ADC-reference current can be made larger than the output current (i.e., iadc>iout) and can be adjusted to discharge the capacitor. During the acquisition time, the capacitor is charged and discharged repeatedly. For an acquisition time of nt·tclk, the voltage across the capacitor has an average of vref (i.e., the voltage reference). This can be translated by the total voltage developed during the charging time $$\left(i.e., n2 \cdot \frac{tclk}{C} iout\right)$$

is equal to the total voltage developed during the discharging time $$\left(i.e., n1 \cdot \frac{tclk}{C} [iadc - iout]\right).$$

Based on this, it can be shown that:

$$iwe=(n1/nt)iadc-ioff \qquad (5)$$

The offset current (ioff) can be useful for the clocked dual-slope ADC as it provides comparable slew rates for the voltage across the capacitor during the charging and discharging which in turns improve the linearity. So, while useful for the clocked dual-slope ADC, the offset current may affect the measurement (e.g., accuracy) of the work electrode current. For example, if the offset current and the ADC-reference current drift with temperature differently (i.e., have different temperature coefficients) the measurement of the work electrode current can appear to have a very high temperature coefficient. Accordingly, calibrating the offset current can allow the clocked dual-slope ADC to utilize the benefit (i.e., linearity) of the offset current without the drawback of a reduction in measurement accuracy.

Figure 6:
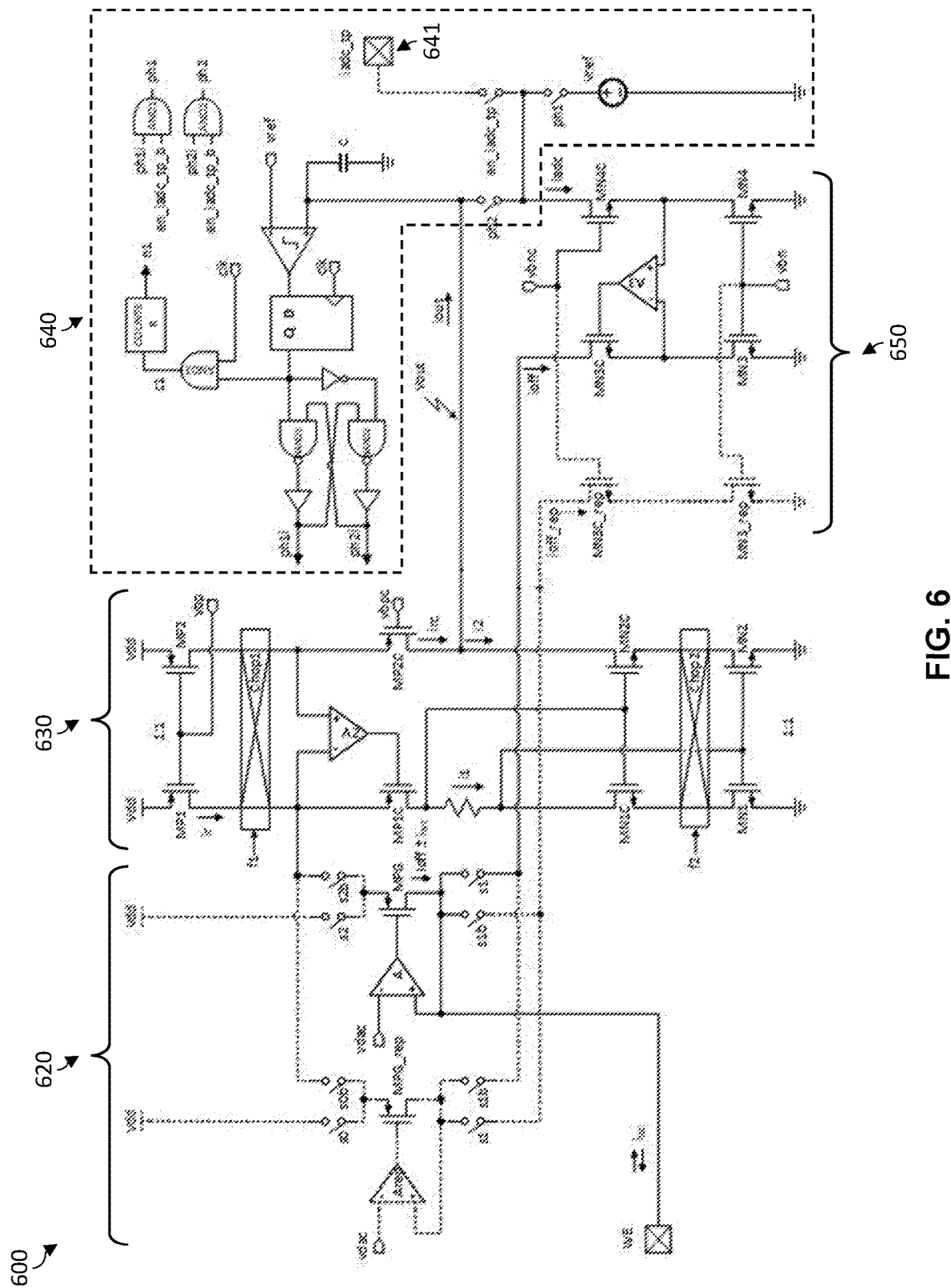
FIG. 6 illustrates a bidirectional potentiostat with offset calibration according to an implementation of the present disclosure.

FIG. 6 illustrates a bidirectional potentiostat according to an implementation of the present disclosure. The bidirectional potentiostat 600 includes a built-in-offset calibration (i.e., cancellation) circuit. In other words, the bidirectional potentiostat includes a front-end portion 620 that can be configured for a normal (i.e., default) operation or for a calibration operation. The front-end portion includes a first feedback amplifier and a second (i.e., replica) feedback amplifier that can be alternatively coupled to the current-conveyer portion 630.

The bidirectional potentiostat 600 further includes a clocked dual-slope ADC 640 configured to convert the current flowing (e.g., in either direction) through the work electrode (WE) to a digital word (e.g., n1). The bidirectional potentiostat 600 may be further configured to modify the digital work using a calibration factor stored in a memory to obtain a measurement of the work electrode current.

A current-conveyer portion 630 of the bidirectional potentiostat 600 includes a first cascode current mirror formed by transistor MP1, MP2, MP1C and MP2C. The first cascode current mirror includes a first chopper (i.e., Chop1) coupled between PMOS transistors MP1 and MP2 and PMOS transistors MPC1 and MPC2 of the first cascode current mirror. The first chopper (Chop1) is configured by a clock signal (f1) to alternatively couple (i) the drain of MP1 to the source of MP1C and to the source of MP2C and (ii) the drain of MP2 to the source of MPC1 and to the source of MP2C. The first chopper (Chop1) is configured to suppress (e.g., eliminate) a mismatch (e.g., random mismatch) associated with the first cascode current mirror configuration.

The first cascode current mirror further includes an amplifier (A2) coupled at an inverting input to a source terminal of MPG and a drain terminal of MP1 and coupled at a non-inverting input to a drain terminal of MP2. The amplifier (A2) is configured to maintain a voltage at the drain of MP1 equal to the voltage at drain of MP2 regardless of the value of the current (i1) flowing through the transistor MP1C, which depends on the value of the work electrode current, iwe. Thus, amplifier (A2) reduces the systematic mismatch (e.g., due to channel length modulation) of MP1 and MP2 by keeping their source to drain voltage equal.

The bidirectional potentiostat 600 further includes a second cascode current mirror formed by transistors MN1, MN2, MNC1 and MNC2. The second cascode current mirror includes a second chopper (Chop2) driven by a second clock signal (f2) that is twice the first clock signal (i.e., 2f1).

The bidirectional potentiostat 600 further includes an offset portion 650 that includes a third cascode current mirror (i.e., source) formed by MN3, MN4, MN3C and MN4C, which is configured to generate the offset current ioff and the ADC-reference current iadc. The third cascode current source include a third amplifier (A3) configured to boost the output impedance of the offset current source (as ioff is connected to the WE and the WE voltage may vary) and to reduce the systematic mismatch between ioff and iadc.

The offset current, ioff, is used intentionally to allow the potentiostat to convert current flowing through the WE in both direction (bidirectional) and also to improve the linearity of the digital conversion (i.e., conversion) and therefore to reduce the gain error especially when the WE current (iwe) is low compared to the ADC-reference current (iadc). As shown in FIG. 6, the output current (iout) can be expressed by the equation below, supposing that the work electrode is flowing from the work electrode to the electrochemical cell.

$$iout = ioff + iwe \quad (6)$$

Figure 7:
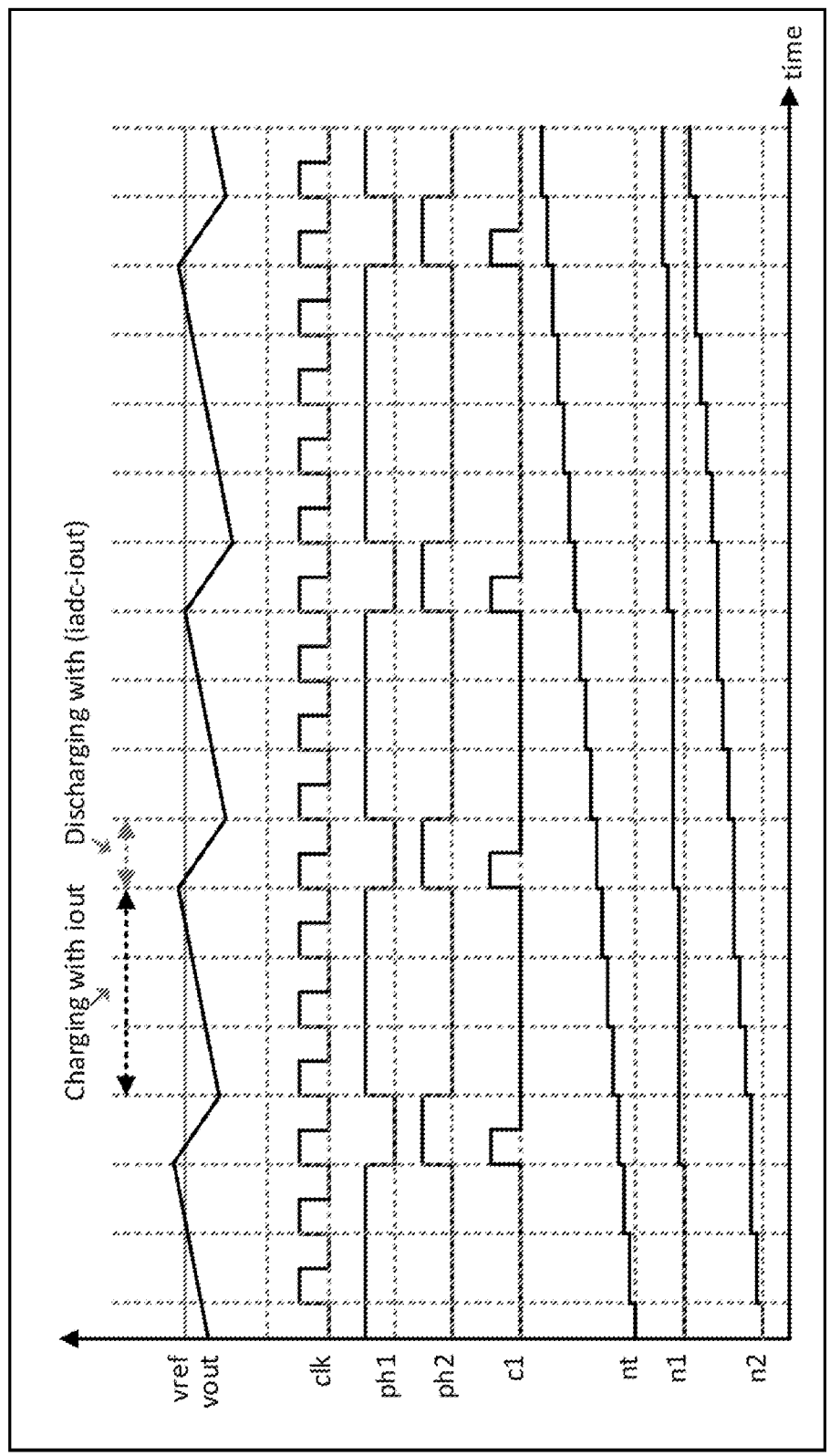
FIG. 7 illustrates a timing diagram of signals associated with the bidirectional potentiostat of FIG. 6 according to an implementation of the present disclosure.

The bidirectional potentiostat 600 includes a clocked dual-slope ADC configured to convert the output current (iout) to a digital word (n1). FIG. 7 is a timing diagram for the clocked dual-slope ADC 640 of FIG. 6. As shown in the timing diagram, during the phase ph2 (i.e., ph2=HIGH), the capacitor is discharged with the current, iadc-iout, while during the phase ph1 (i.e., ph1=HIGH) it is charged with the current, iout. For a given acquisition time (i.e., nt·Tclk), the voltage developed during the charging and discharging time is the same, which leads to the equation below.

$$n1(iadc - iout) \cdot Tclk = n2 \cdot iout \cdot Tclk \quad (7)$$

Equation (7) and equation (6) can be manipulated to obtain an equation for the work electrode current, as shown in the equation below.

$$iwe = (n1/nt) \cdot iadc - ioff \quad (8)$$

As shown in the equation above, conversion of iwe includes the ADC-reference current (iadc) and the offset current (ioff), which correspond to a gain/slope and an offset of the potentiostat, respectively. In order to achieve an accurate measurement of iwe with a very low temperature drift, both currents iadc and ioff must have a very low temperature coefficient. A mismatch between iadc and ioff can lead to the currents having opposite temperature coefficients. Accordingly, without calibration, the temperature coefficient of iwe could be significantly high. Besides the mismatch effect, the finite output impedance of ioff could lead to significant current variations as well as temperature coefficient variations regarding an applied WE voltage, which is substantial in the case of a rail-to-rail potentiostat. The potentiostat of FIG. 6 includes the calibration circuit to alleviate these effects.

The calibration circuit of the bidirectional potentiostat includes a replica of the feedback amplifier (Arep and MPG_rep), a replica of the offset current formed by transistors MN3_rep and MNC3_rep, and the switches s0, s0b, s1, s1b, s2, s2b and en_idac_tp.

To extract (i.e., measure) the gain of the potentiostat, the switch en_idac_tp is turned ON. This routes the ADC-reference current (iadc) to an output PAD 641 to isolate it from the clocked dual-slope ADC 640. The ADC-reference current, iadc, can then be trimmed to its best temperature coefficient, measured, and stored. The measured value of the ADC-reference current (iadc) represents the gain of the potentiostat (see eqn. (8)).

The offset current (ioff) can depend on a temperature of the bidirectional potentiostat and on a WE voltage. The bidirectional potentiostat 600 can be configured to measure (i.e., calibrate) and remove the offset current to reduce the effects of these dependencies. The implemented calibration circuit of FIG. 6 can calibrate the offset current while keeping the potentiostat main functionality (i.e., setting the voltage on the WE and keep the current flowing through it). Indeed, the source of the pass gate transistor (MPG) of the feedback amplifier (A, MPG) can be disconnected from the drain of MP1 via the switch s02b (i.e., s02b is set OFF) and connected to the supply voltage through the switch s02. The source of the replica feedback amplifier MPG_rep is initially connected to the supply voltage. The replica of the offset current ioff_rep formed by transistors MN3_rep and MN3C rep and the offset current ioff are switched respectively from the drain of transistor MPG_rep and the drain of MPG via the switches s1 and s1b. The source of MPG_rep is then connected to the drain of MP1 through the switch s0b. In this case, the output current (iout) is equal to the offset current ioff and the clocked dual-slope ADC is configured to convert only the offset current, according to the equation below.

$$ioff = (noff/nt) \cdot iadc \quad (9)$$

The value noff can be stored and used to cancel the effect of the offset current on the measured work electrode current.

Once the offset current is extracted, the source of the pass gate transistor MPG_rep can be disconnected from the drain of MP1 and connected back to the supply voltage via the switches s0 and s0b. The offset current replica ioff_rep and the offset current ioff are switched respectively from the drain of transistor MPG and the drain of MPG_rep via the switches s1 and s1b. The source of MPG is then disconnected from the supply voltage then connected to the drain of MP1 through the switch s2b. After the current offset extraction, the clocked dual-slope ADC conversion is given by the equation below.

$$iwe = [(nwe - noff)/(nt)] \cdot iadc \quad (10)$$

The disclosed circuits and techniques may have a plurality of benefits. One benefit is the built-in self-current offset cancellation can remove the effect of the offset current on the WE current conversion and therefore significantly reduce the temperature drift and the WE voltage dependency. Another benefit is the built-in self-current offset cancellation may not affect and/or interrupt the potentiostat main functionality because the offset current is converted (i.e., calibrated) while the WE voltage is set and the current is flowing through it. Another benefit is there may be no need for dedicated circuits to generate high precision reference currents covering the measurement ranges for calibration. Another benefit may be a reduction in time for calibration (i.e., a calibration time) compared to another approach (e.g., a best fit approach).

Figure 8:
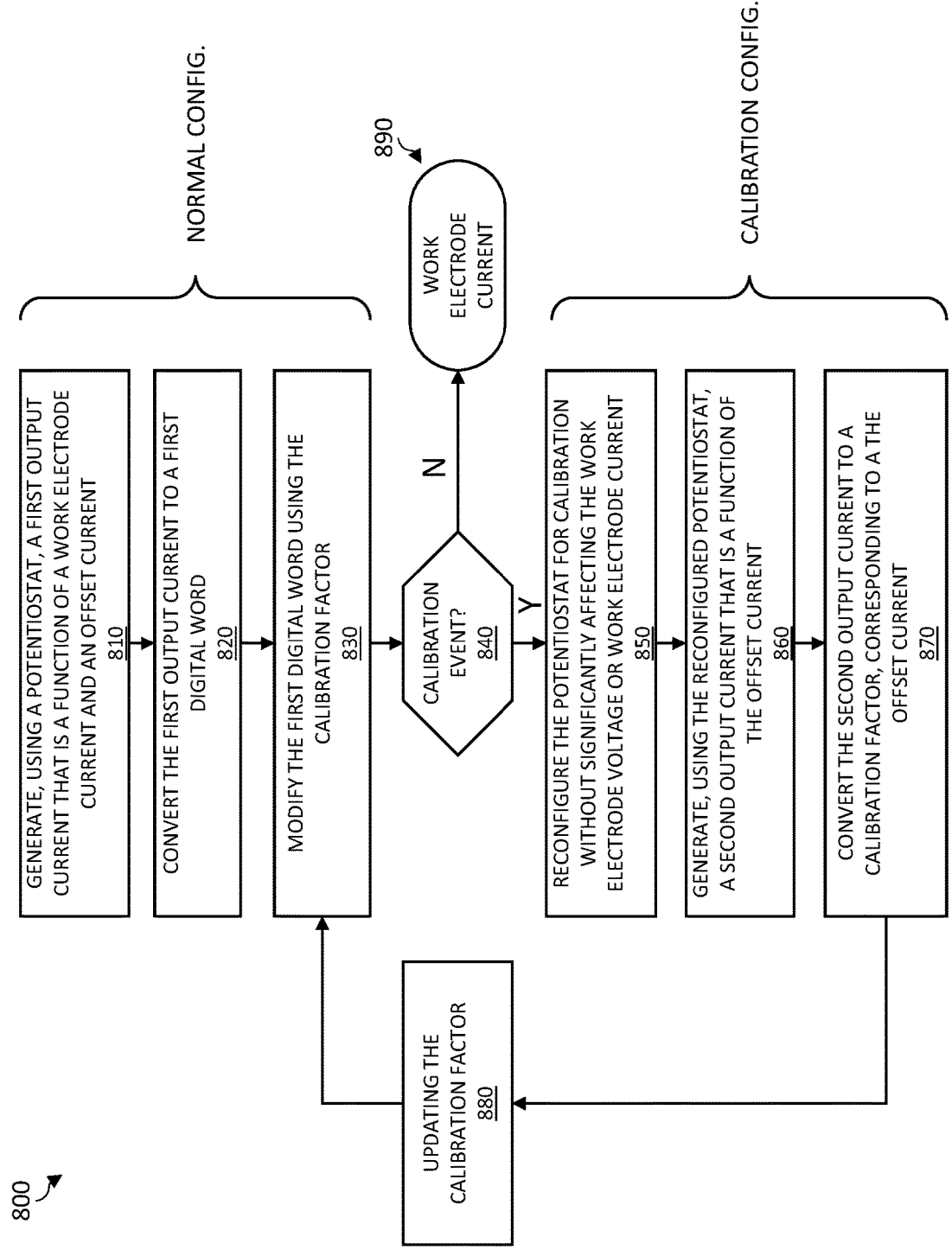
FIG. 8 illustrates a flowchart of a method for measuring a work electrode current according to an implementation of the present disclosure.

FIG. 8 illustrates a flowchart of a method for measuring a work electrode current according to an implementation of the present disclosure. In the method 800, an output current (iout) at a first time (i.e., a first output current) is generated 810 using a bidirectional potentiostat (i.e., in a normal configuration). The first output current is a function of a work electrode current (iwe) and an offset current (ioff). The first output current is then converted 820 (e.g., by a clocked dual-slope ADC) to a first digital word. The digital word is then modified 830 using a calibration factor corresponding to a measurement of the offset current. The modification can remove the offset current from the digital word so that what is output 890 (i.e., from the potentiostat) is a measurement of the work electrode current (iwe). If a calibration event is detected 840, however, then the calibration factor may be created or updated 880. A calibration event can be triggered by a variety of sources. For example, a calibration event can be an event triggered by a change in an operating condition (e.g., temperature, work electrode voltage, etc.), an event triggered by a schedule (e.g., expiration of a timer after a period), or an event triggered by a user (e.g., user input). If a calibration event is detected 840, then the bidirectional potentiostat can be reconfigured 850 for (offset current) calibration without significantly affecting the work electrode voltage or the work electrode current. Then, using the reconfigured potentiostat (i.e., potentiostat in a calibration configuration), a second output current, which is a function of the offset current (i.e., does not include a work electrode current component), is generated 860. The second output current is then converted 870 to a second digital word representing a calibration factor corresponding to the offset current (i.e., a calibration factor of the offset current). A calibration factor, stored in a memory, may then be updated 880 using the second digital word. Alternatively, in a first calibration of the offset current, the calibration factor may be added to the memory. In either case, the calibration factor may be retrieved from the memory and used to modify 830 the first digital word in output 890 a measurement of the work electrode current (without an offset current component).

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A method for measuring a work electrode current, the method comprising:
generating, using a potentiostat coupled to a work electrode, a first output current, the first output current including a work electrode current component and an offset current component, the offset current component generated by an offset current source of the potentiostat;
converting the first output current to a first digital word;
modifying the first digital word using a calibration factor stored in a memory to obtain a measurement of the work electrode current;
detecting a calibration event; and
performing a calibration to measure the offset current component by:
reconfiguring the potentiostat for the calibration;
generating, using the reconfigured potentiostat, a second output current, the second output current being a measurement of the offset current component;
converting the second output current to a second digital word; and
updating the calibration factor stored in the memory according to the second digital word.

2. The method for measuring a work electrode current according to claim 1, wherein the calibration event corresponds to a change in an operating condition of the potentiostat.

3. The method for measuring a work electrode current according to claim 1, wherein the calibration event corresponds to a schedule.

4. The method for measuring a work electrode current according to claim 1, wherein the calibration event corresponds to a user input.

5. The method for measuring the work electrode current according to claim 1, wherein performing the calibration includes:

maintaining a work electrode voltage and a work electrode current at the work electrode while performing the calibration.

6. The method for measuring a work electrode current according to claim 1, wherein the calibration factor corresponds to a digital measurement of the offset current component generated by the offset current source.

7. The method for measuring a work electrode current according to claim 1, wherein the reconfiguring includes adjusting circuitry of a front-end portion of the potentiostat to measure the offset current component generated by the offset current source without altering a work electrode voltage of the potentiostat.

8. The method for measuring a work electrode current according to claim 1, wherein converting the first output current to a first digital word and converting the second output current to a second digital word is performed using a dual-slope analog-to-digital converter.

9. The method for measuring a work electrode current according to claim 8, wherein:
the first digital word corresponds to a first number of clock cycles taken to charge a capacitor of the dual-slope analog-to-digital converter using the work electrode current component and the offset current component; and
the second digital word corresponds to a second number of clock cycles taken to charge the capacitor of the dual-slope analog-to-digital converter using the offset current component.

10. The method for measuring a work electrode current according to claim 9, wherein the modifying the first digital word using a calibration factor stored in a memory to obtain a measurement of the work electrode current includes:
subtracting the second number of clock cycles from the first number of clock cycles to obtain a third number of clock cycles taken to charge the capacitor of the dual-slope analog-to-digital converter using the work electrode current component.

11. A method for configuring a potentiostat coupled to a cell, the method including:
coupling a front-end portion of the potentiostat to a work electrode of the cell, the front-end portion including a first feedback amplifier and a replica feedback amplifier that are substantially identical;
configuring the potentiostat in a normal configuration for measuring a work-electrode current, wherein the configuring the potentiostat in the normal configuration includes:
coupling the first feedback amplifier to a sensing and digitizing portion of the potentiostat; and
decoupling the replica feedback amplifier from the sensing and digitizing portion of the potentiostat;
triggering a calibration of an offset current, the offset current added to the work-electrode current by the potentiostat; and
configuring the potentiostat in a calibration configuration for measuring the offset current, wherein the configuring the potentiostat in the calibration configuration includes:
decoupling the first feedback amplifier from the sensing and digitizing portion of the potentiostat; and
coupling the replica feedback amplifier to the sensing and digitizing portion of the potentiostat.

12. The method according to claim 11, wherein measuring the work-electrode current includes:
generating a first measurement of a charging period of a capacitor and a second measurement of a discharging period of the capacitor to digitize the work-electrode current.

13. The method according to claim 11, wherein triggering the calibration of the offset current includes detecting a calibration event.

14. The method according to claim 11, wherein:
configuring the potentiostat in the normal configuration further includes:
coupling an offset current source to the work electrode and the first feedback amplifier; and
coupling a replica offset current source to the replica feedback amplifier; and
configuring the potentiostat in the calibration configuration further includes:
coupling the offset current source to the replica feedback amplifier; and
coupling the replica offset current source to the work electrode and the first feedback amplifier.

15. The method according to claim 14, wherein:
configuring the potentiostat in the normal configuration further includes:
maintaining a work electrode voltage and the work-electrode current at the work electrode of the cell using the first feedback amplifier and the offset current source; and
configuring the potentiostat in the calibration configuration further includes:
maintaining the work electrode voltage and the work-electrode current at the work electrode of the cell using the first feedback amplifier and the replica offset current source.

16. The method according to claim 14, wherein:
configuring the potentiostat in the normal configuration further includes:
receiving a first output current including a work electrode current component and an offset current component at the sensing and digitizing portion; and
configuring the potentiostat in the calibration configuration further includes:
receiving a second output current including the offset current component at the sensing and digitizing portion.

17. The method according to claim 16, wherein:
configuring the potentiostat in the normal configuration further includes:
configuring the sensing and digitizing portion to use a calibration factor to remove the offset current component from the first output current in order to generate a measurement of the work-electrode current; and
configuring the potentiostat in the calibration configuration further includes:
create/update the calibration factor corresponding to the offset current component.

18. The method according to claim 11, wherein the potentiostat further includes:
a current-conveyer portion coupled between the front-end portion and the sensing and digitizing portion, the current-conveyer portion including a first current mirror and a second current mirror.

19. The method according to claim 18, wherein the first current mirror and the second current mirror are each a cascode current mirror.

20. The method according to claim 18, wherein the first current mirror and the second current mirror each include a chopper.

21. A method for calibrating a potentiostat coupled to a cell, the method including:
- detecting a calibration event, the calibration event corresponding to a change in an offset current generated by an offset current source of the potentiostat;
- configuring, in response to the calibration event, the potentiostat in a calibration configuration;
- measuring the offset current at an output of a digitizer of the potentiostat in the calibration configuration;
- determining a calibration factor corresponding to the offset current; and
- storing the calibration factor for use by the potentiostat in a normal configuration to remove the offset current from the output of the digitizer of the potentiostat in the normal configuration to obtain a measurement of a work-electrode current.

22. The method according to claim 21, wherein the calibration event includes a change in an operating condition of the potentiostat.

23. The method according to claim 21, wherein the configuring, in response to the calibration event, the potentiostat includes enabling circuits of the potentiostat to measure the offset current without altering a work electrode voltage of the potentiostat.

* * * * *